United States Patent
Krieger et al.

(10) Patent No.: US 7,098,648 B2
(45) Date of Patent: Aug. 29, 2006

(54) AUTOMATIC RANGE FINDER FOR ELECTRIC CURRENT TESTING

(75) Inventors: Gedaliahoo Krieger, Rehovot (IL); Peter P. Cuevas, Los Gatos, CA (US); James Borthwick, Sunnyvale, CA (US)

(73) Assignee: Qualitau, Inc., Santa Clara, CA (US)

( * ) Notice: Subject to any disclaimer, the term of this patent is extended or adjusted under 35 U.S.C. 154(b) by 46 days.

(21) Appl. No.: 10/868,520

(22) Filed: Jun. 14, 2004

(65) Prior Publication Data
US 2005/0206367 A1   Sep. 22, 2005

Related U.S. Application Data

(60) Provisional application No. 60/553,859, filed on Mar. 16, 2004.

(51) Int. Cl.
*G01R 1/00* (2006.01)
(52) U.S. Cl. .................. 324/158.1; 324/117 R
(58) Field of Classification Search ..... 324/117 R–117 H, 115–116, 130, 133; 340/660–661; 702/64, 702/66–67
See application file for complete search history.

(56) References Cited

U.S. PATENT DOCUMENTS

| | | | | |
|---|---|---|---|---|
| 3,187,323 A * | 6/1965 | Flood et al. | ................. | 341/139 |
| 4,000,463 A * | 12/1976 | Katzmann et al. | .......... | 324/132 |
| 4,105,967 A * | 8/1978 | Macemon | .................... | 324/115 |
| 4,288,152 A * | 9/1981 | Matsuda | ..................... | 396/106 |
| 4,994,733 A * | 2/1991 | Yasunaga | .................... | 324/115 |
| 5,144,154 A * | 9/1992 | Banaska | ..................... | 327/427 |
| 5,289,191 A * | 2/1994 | Elms | ........................... | 341/127 |
| 5,920,189 A * | 7/1999 | Fisher et al. | ................ | 324/115 |
| 6,441,674 B1* | 8/2002 | Lin | ............................ | 327/512 |

* cited by examiner

*Primary Examiner*—Vinh P. Nguyen
(74) *Attorney, Agent, or Firm*—Beyer Weaver & Thomas LLP

(57) ABSTRACT

In an electrical circuit for testing electrical current using a plurality of precision resistors connected in parallel or in series, a range finder for receiving the current to be measured with the voltage drop across the range finder being indicative of a current sub-range for measurement. In a preferred embodiment, a range finder has a first bipolar transistor and a second bipolar transistor connected in parallel and in opposite polarity with the emitter and base of each transistor connected together whereby each transistor functions as an emitter-base diode.

9 Claims, 4 Drawing Sheets

Current "Source"

$I_1 = c\ [\exp(q|V|/(kT)) - 1]$ $I_2 = c\ [\exp(-q|V|/(kT)) - 1]$

Current "Sink"

$I_1 = c\ [\exp(-q|V|/(kT)) - 1]$ $I_2 = c\ [\exp(q|V|/(kT)) - 1]$

AUTOMATIC RANGE FINDER FOR ELECTRIC CURRENT TESTING

CROSS-REFERENCE TO RELATED APPLICATIONS

This application claims priority from copending provisional application Ser. No. 60/553,859, filed Mar. 16, 2004, which is incorporated herein by reference for all purposes.

BACKGROUND OF THE INVENTION

This invention relates generally to measuring electrical current such as in semiconductor device testers, and more particularly the invention relates to the use of a current range finder to expedite the selection of current sub-ranges for testing.

Measuring electric current (hereinafter "current") accurately is a key requirement for all parametric testers, in particular those used for semiconductor devices characterization ("SPT" for "Semiconductor Parametric Tester"). The wide range of semiconductor devices and applications implies measured current levels as low as $1e-12$ A (pA) and as high as 1 A, namely many orders of magnitude or decades of current. This leads to optimization techniques, in which the entire range of current is divided into several sub-ranges, where the critical measuring components are switched in and out automatically during measurement, until the best sub-range is found and the measured data acquired.

A typical example is the Output Characteristics of an active device, such as a Bipolar or MOS transistor. A constant stimulus (voltage for MOS, current or voltage for Bipolar) is applied to the control pin (gate, base, respectively), while another stimulus (voltage) is applied between the output pin (drain, collector, respectively) and the common pin (source, emitter, respectively), and varied sequentially by equal steps from minimum to maximum values, with the respective output current measured accordingly. After the sequence is complete the stimulus at the control pin is stepped to another constant value, and the output sequence repeated until a "family" of output sequences is generated, each corresponding to constant stimulus at the control pin (referred to as "parameter"). Stepping from one point to the next, along a sequence, does not usually require a new sub-range, with only a small number of points requiring a single sub-range change. However, the transition from the last point of one sequence to the first point of the next sequence often requires many such changes until the optimized sub-range is reached. This takes more time, as changing sub-range requires additional time delays to assure "glitch-free" transition. As minimizing the overall measurement time is commonly required, reducing these delays is more than desirable.

The present invention provides an efficient way to reduce the delay time due to multiple sub-range changes, by practically assuring a single sub-range change regardless how many sub-ranges separate between the last measured point and the new one. More specifically, considering an added time delay "T" per sub-range change, the total related time delay when "n" such changes are required to reach the optimized sub-range is nT. In contrast, using this invention the time delay is just T; namely reducing measurement time for such step by $nT-T=(n-1)T$.

The present invention provides an effective method of selecting the current sub-range for measurement.

SUMMARY OF THE INVENTION

In accordance with the invention, a range selector is utilized in selecting a current sub-range for measurement. More particularly, a single sub-range can be selected from multiple sub-ranges by first identifying a range of current to be measured.

In carrying out the invention, in one embodiment a range finder comprising a pair of diode-connected bipolar transistors are connected in parallel and in opposing directions for use with a current source or a current sink. By shorting the base-collector junction of each transistor, the base-emitter junction overcomes the high current limitation caused by high base resistance as most of the current flows into the collector which has much lower resistance.

The invention and objects and features thereof will be more readily apparent from the following detailed description and appended claims when taken with the drawings.

DETAILED DESCRIPTION OF ILLUSTRATIVE EMBODIMENTS

Most high accuracy current measuring systems (SPTs in particular) utilize sensing element(s), connected in series with the load. In general, the measured magnitude is the resulting voltage across the sensing element, while its a-priori known current vs. voltage relation is used to determine the current. Typically, high precision resistors are the preferred sensing elements, since: (i) they follow a linear current vs voltage relation (Ohm's law) almost perfectly; (ii) they are hardly influenced by temperature; (iii) they are easily available over a wide range of values, as required for the different sub-ranges; and (iv) overall, their performance to price ratio is excellent. However, since high voltage drops across such resistors limit the maximum voltage available to the load on one hand, while very low voltage drops compromise measurement accuracy on the other hand, most current sub-ranges cover only one or two orders of magnitude. This translates to many current sub-ranges, as shown in FIG. 1.

The current (I) is forced into the load ($R_L$) by the voltage (or current) source represented by As. Note that the complex circuit maintains the necessary output voltage across the load $R_L$ (voltage source), or the necessary current (current source), which is not shown. Also, the direction of current flow and the resulting voltage drop shown in FIG. 1 represent "source" mode, while an opposite current direction is referred to as "sink". As the invention is equally applicable to both modes, selecting one representation does not diminish the generality of the invention and the following description. Each sub-range corresponds to one of n precision resistor, where all but the selected one are shunted by relays of a switch control circuit; thus adding no series resistance at all. The selected resistor ($R_m$ in FIG. 1) is the only resistor not shunted by its relay, causing the current I to flow though it with the resulting voltage drop Vi=IRm sampled by the differential amplifier Ai. Note that for Ai both input current (leakage) and the common-mode gain should be negligible, in order to assure the same current flowing through the selected sub-range resistor and $R_L$, as well as true differential output.

Figure 1:
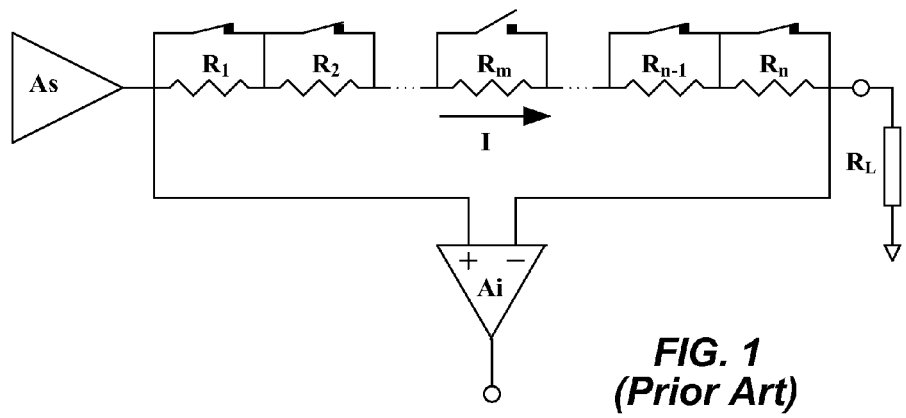
FIG. 1 is a schematic of a conventional current measuring circuit for selectively measuring sub-ranges of a current.

The particular arrangement of the sensing resistors, $R_1$ through $R_n$, in FIG. 1 represents a commonly used yet specific embodiment. There are numerous other such embodiments, all within the scope of this invention, where the resistors are arranged in parallel, or in different combinations of several "banks" of parallel resistors in series. Furthermore, a sub-range can be associated with a combination of specific resistors rather than a single resistor. In this respect, the invention is applicable to all such embodiments.

The invention determines the optimized sub-range of the switch control circuit within a single reading, resulting in one switching step rather than several, all by modifying the circuit of FIG. 1 with no significant penalty on performance. The concept is shown in the embodiment of FIG. 2.

Figure 2:
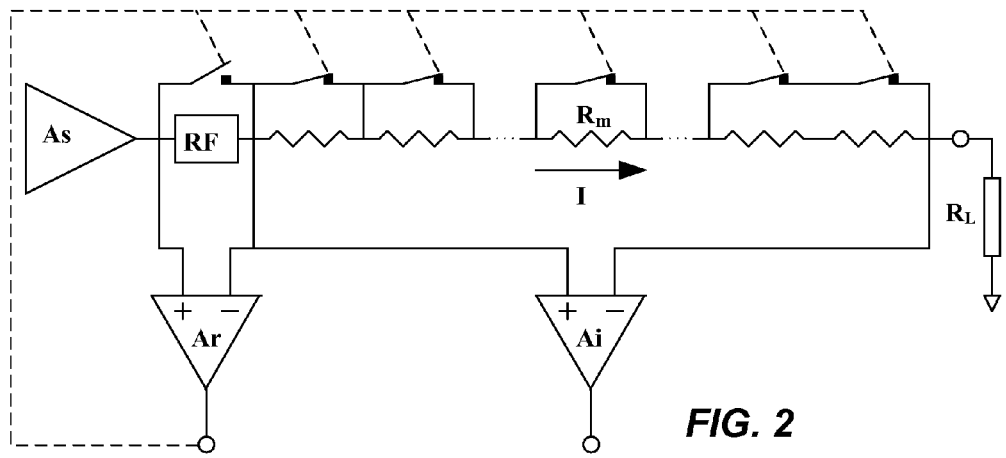
FIG. 2 is a schematic of a current measuring circuit in accordance with one embodiment of the invention.

FIG. 2 is similar to FIG. 1, except for one important addition; a new element called RF (Range Finder), in series with the current sensing resistors. As the current flows through RF the resulting voltage-drop across RF is sampled by the differential amplifier Ar. At the same time, the first differential amplifier Ai has zero output, as resistors $R_1$ through $R_n$ are shunted by their respective relays. RF must have a well defined and consistent current vs voltage relation, applicable to the entire current range (i.e. from about $1e-12$ A to about 1 A), where the resulting voltage drop across it should be sufficiently high to yield accurate measurement, but small enough not to diminish the maximum voltage available at the load. For example, in case the system is limited by its power supply to a maximum load voltage of 25 V, a maximum voltage drop across RF of 10 V will be too much, as it practically limits the maximum load voltage to 25 V–10 V=15 V. In contrast, if the highest voltage drop across RF is only 2 V, the resulting maximum voltage available across the load will only be 23 V; probably an acceptable price for the newly gained benefit. Further, unlike the current sensing resistors, RF is not intended for accurate current measurement, but for a reliable indication of the optimized range to be used. Typically, a sub-range extends over one decade of current (for example, 1 mA to 10 mA), so finding the proper range should not be too demanding. The only case where a second corrective step may be needed is at the boundary region between too adjacent sub-ranges. However, even in such less likely situations the resulting time delays are significantly shorter than the maximum possible delay experienced without RF.

Figure 3:
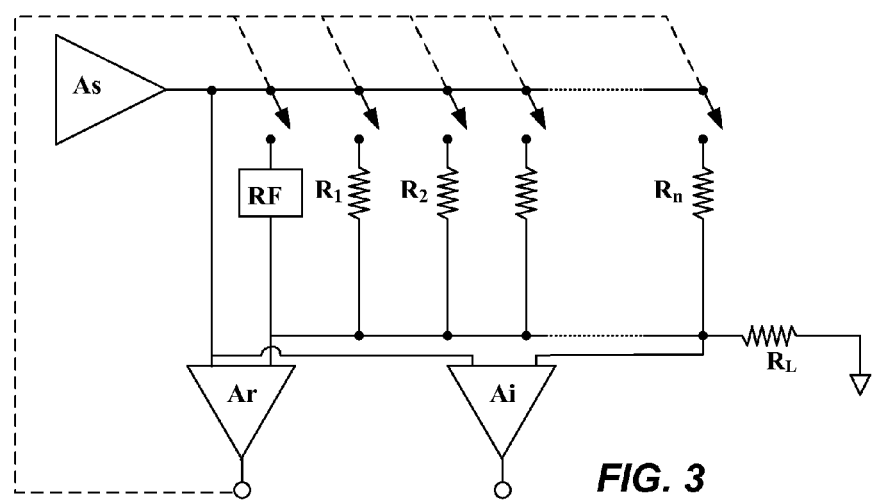
FIG. 3 is a schematic of a current measuring circuit in accordance with another embodiment of the invention.

FIG. 3 is a circuit similar in function to the circuit of FIG. 2, but in FIG. 3 the resistors are in parallel and the switches of the switch control circuit are closed only for selected resistors.

A diode formed by a P-N junction is a readily available element which in principle meets the necessary requirements from an adequate Range Finder. Diode current vs voltage relation is $I=c[\exp(qV/(bkT))-1]$, where c is a constant prefactor, V is the voltage across the diode while the current I flows through it, q is the elementary charge, T is the absolute temperature and b is a "correction factor" (ideally one, but could be higher in particular in diodes designed for high current). At room temperature (about 27° C. or 300 K), $q/(kT)$ is approximately 26 mV, meaning that for V>>26 mV the relation is practically exponential. When V is negative, the current quickly approaches the value of c asymptotically, which is the reason why c is often referred to as "Saturation Current".

Figure 4A:
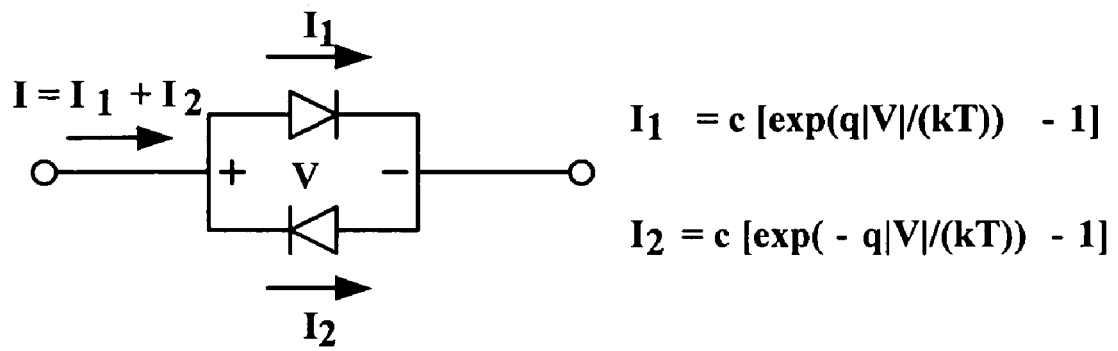
FIGS. 4A, 4B are schematics of parallel back to back diodes.
Figure 4B:
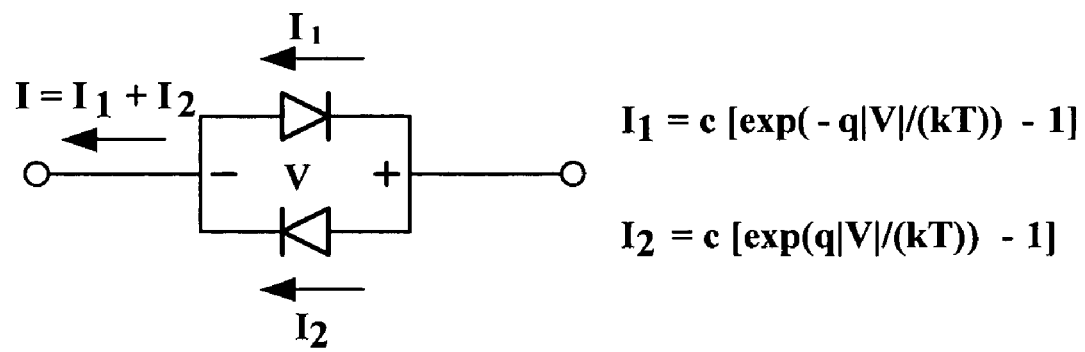

To function in both "source" and "sink" modes (current flows in the direction shown in FIGS. 1 and 2 or in the opposite direction, respectively), a back-to-back combination is provided as shown in FIGS. 4A, 4B. Here, for $|V|>q/(kT)$ the forward biased diode is dominant, making the overall impact of the one in reverse almost negligible. Choosing similar diodes practically assures similar values of c for both, although the diodes can have different values of c and still work.

Figure 5:
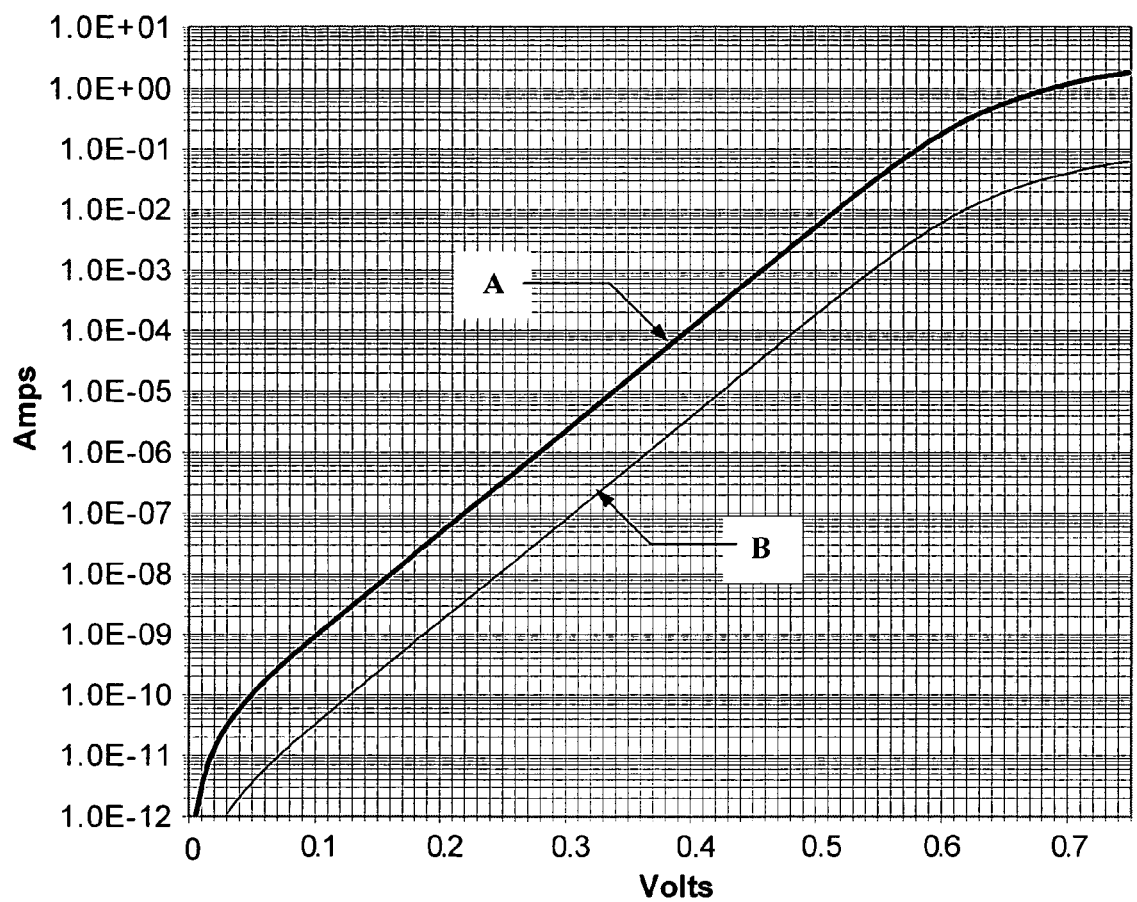
FIG. 5 is a graph of current (amperes) versus voltage (volts) for the diodes illustrated in FIGS. 4A and 4B.

However, it is hard to find diodes which exhibit such desirable behavior over the entire range of current. Commonly used low-current diodes present "near-ideal" current vs voltage relation down to sub pA level; however, their relatively high series resistance leads to current "roll-of" below 50 mA (curve "B" in FIG. 5). Since the highest sub-range (about 100 mA to 1 A) cannot be compromised, this presents a fundamental limitation. In contrast, a compromised low region, (due to significantly higher saturation current) can be tolerated, as long as the highest sub-range is attainable (curve "A" in FIG. 5). This is simply because the lowest current sub-range extends from about 1 nA down to the minimum measurable level (1 pA or even less), where each of the higher sub-ranges covers about one decade of current. Therefore, as long as the sharp deviation from semi-log behavior starts below 1 nA or so, it does not make much difference for effective range finding whether it actually starts, for example, at 300 pA or at 5 pA. Given that, the remaining challenge is to find a simple, non-expensive and easily available device with similar current vs voltage relation as curve "A" in FIG. 5.

Figure 6A:
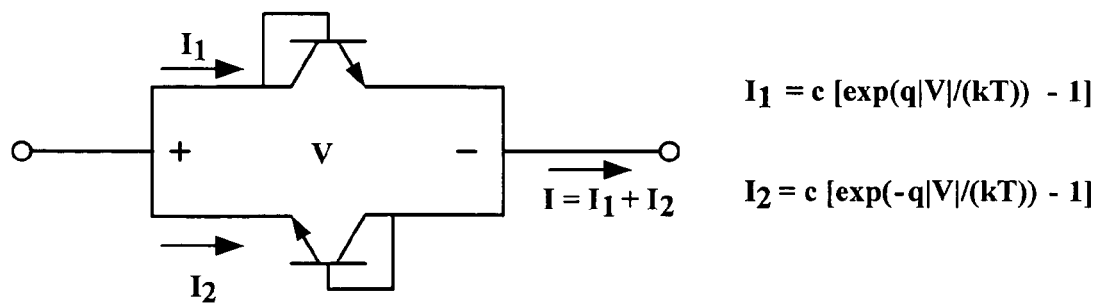
FIGS. 6A, 6B are schematics of range finders in accordance with embodiments of the invention for a current source and a current sink, respectively.
Figure 6B:
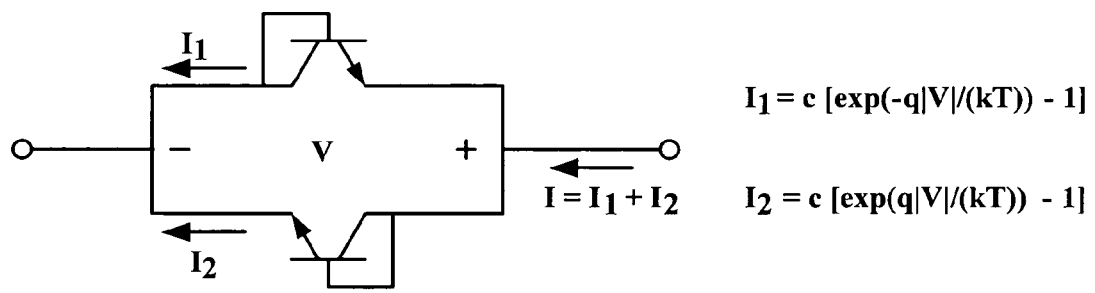

The solution, which is an integral part of this invention, is to use medium-power bipolar transistors, as configured in FIGS. 6A, 6B. By shorting the base-collector junction, the base emitter junction overcomes the high-current limitation caused by inevitably high base resistance, as most of the current flows into the collector with its much lower resistance. In fact, the forward direction transistors (top transistor for current source, bottom transistor for current sink) operate effectively in the common-emitter mode with Vce=Vbe, while the reverse direction transistors (bottom transistor for current source, top transistor for current sink) behave very similarly to the reverse biased base-emitter junction. The only limitation is the relatively high saturation current associated with such transistors. This limitation will certainly disqualify such devices from serving as low current measuring tools; however, detecting whether the measured current is below 1 nA or not is relatively easy. In all, many readily available medium-to-high current bipolar transistors have been proven to yield the required behavior, making them near ideal Range Finders (RFs).

The invention provides an efficient way to reduce time in selecting one of multiple sub-ranges in testing electrical currents. While the invention has been described with reference to a specific embodiment, the description is illustrative of the invention, and is not to be construed limiting the invention. Various modifications and applications may occur to those skilled in the art without departing from the true spirit and scope of the invention as defined by the appended claims.

What is claimed is:

1. A current measurement circuit comprising:
   a) a resistor network including a plurality of resistors selectively connectable for receiving a range of current to be measured, a voltage drop across a resistor being indicative of current, each resistor correesponding to a sub-range of current to be measured,
   b) a range finder selectively connectable for receiving the current to be measured, the voltage drop across the range finder being indicative of a sub-range of current, and
   c) a switch control circuit responsive to voltage drop across the range finder and controlling the connection of the plurality of resistors for receiving the sub-range of current to be measured.

2. The current measurement circuit as defined by claim 1 wherein the range finder comprises a diode sensor.

3. The current measurement circuit as defined by claim 2 wherein the diode sensor comprises a first transistor and a second transistor connected in parallel with each transistor being diode connected.

4. The current measurement circuit as defined by claim 3 wherein the first transistor and the second transistor are bipolar transistors with collector and base of each transistor being ohmically connected.

5. The current measurement circuit as defined by claim 4 wherein the bipolar transistors are npn bipolar transistors.

6. The current measurement circuit as defined by claim 3 wherein the resistor network comprises a plurality of precision resistors connectable in parallel.

7. The current measurement circuit as defined by claim 3 wherein the resistor network comprises a plurality of serially connected precision resistors with each resistor having a switchable low ohmic shunt connector.

8. The current measurement circuit as defined by claim 1 wherein the resistor network comprises a plurality of precision resistors connectable in parallel.

9. The current measurement circuit as defined by claim 1 wherein the resistor network comprises a plurality of serially connected precision resistors with each resistor having a switchable low ohmic shunt connector.

* * * * *